(12) United States Patent
Guo et al.

(10) Patent No.: US 8,354,720 B2
(45) Date of Patent: Jan. 15, 2013

(54) EMBEDDED STRESSOR FOR SEMICONDUCTOR STRUCTURES

(75) Inventors: Dechao Guo, Hopewell Junction, NY (US); Shu-Jen Han, Hopewell Junction, NY (US); Pranita Kulkarni, Albany, NY (US); Philip J. Oldiges, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/529,558

(22) Filed: Jun. 21, 2012

(65) Prior Publication Data

US 2012/0261728 A1 Oct. 18, 2012

Related U.S. Application Data

(62) Division of application No. 12/625,827, filed on Nov. 25, 2009.

(51) Int. Cl.
*H01L 27/12* (2006.01)
(52) U.S. Cl. ........ 257/347; 257/288; 257/369; 257/178; 438/300; 438/285; 438/407; 438/231
(58) Field of Classification Search .................. 257/347, 257/288, 369, 178; 438/300, 285, 149, 231
See application file for complete search history.

(56) References Cited

U.S. PATENT DOCUMENTS

| 2003/0094637 A1 | 5/2003 | Awano |
| 2006/0081875 A1 | 4/2006 | Lin et al. |
| 2006/0138398 A1 | 6/2006 | Shimamune et al. |
| 2008/0001182 A1 | 1/2008 | Chen et al. |
| 2008/0054250 A1 | 3/2008 | Chuang et al. |
| 2008/0079034 A1 | 4/2008 | Komoda |
| 2008/0083948 A1 | 4/2008 | Lin et al. |

OTHER PUBLICATIONS

Da Zhang et al., "Embedded Source/Drain SiGe Stressor Devices on SOI: Integrations, Performance, and Analyses," IEEE Transactions on Electron Devices, vol. 53, Issue 12, pp. 3020-3024; Dec. 2006.

*Primary Examiner* — Telly Green
(74) *Attorney, Agent, or Firm* — Cantor Colburn LLP; Vazken Alexanian

(57) ABSTRACT

A semiconductor structure includes a semiconductor substrate; a gate stack on the semiconductor substrate; a plurality of spacers disposed on laterally opposing sides of the gate stack; source and drain regions proximate to the spacers, and a channel region subjacent to the gate stack and disposed between the source and drain regions; and a stressor subjacent to the channel region, and embedded within the semiconductor substrate, the embedded stressor being formed of a triangular-shape.

10 Claims, 7 Drawing Sheets

EMBEDDED STRESSOR FOR SEMICONDUCTOR STRUCTURES

CROSS-REFERENCE TO RELATED APPLICATION

This application is a divisional of U.S. patent application Ser. No. 12/625,827, filed Nov. 25, 2009, the disclosure of which is incorporated by reference herein in its entirety.

BACKGROUND

The present invention relates to semiconductor structures, and more specifically, to the formation of a planar metal oxide semiconductor field-effect transistor (MOSFET) structure with high electron mobility using channel engineering.

To enhance the performance of MOS devices, stress may be introduced in the channel region of the MOSFET to improve carrier mobility. It is desirable to induce a tensile stress in the channel region of an n-type metal oxide semiconductor (NMOS) device in a source-to-drain direction, and a compressive stress in the channel region of a p-type metal-oxide-semiconductor (PMOS) device in a source-to-drain direction.

Current n-FET High-k/Metal-Gate (HKMG) technology utilizes a silicon nitride stress liner on top of silicon surfaces to achieve higher electron mobility. Aggressive PC pitch and height scaling in advanced complementary metal oxide semiconductor (CMOS) technologies result in lower benefits from the use of stress liners. Therefore, embedded stress elements are being used in place of the stress liners.

Embedded silicon germanium (SiGe) is used to improve performance of the PMOS device. Embedded silicon carbon can be used to improve performance of the NMOS device. By introducing embedded stress elements, the channel stress can be further enhanced thereby resulting in even higher drive currents. FIG. 1 is a diagram of an NMOS device. As shown in FIG. 1, the MOS device 10 includes a gate stack 13 on a silicon substrate 12. The gate stack 13 includes a gate electrode 14 disposed on a gate dielectric 16. A polysilicon layer 17 and a silicide layer 18 are formed over the gate electrode 14. The MOS device 10 further includes spacers 19a and 19b and 20a and 20b on sidewalls of the gate stack 13, and source and drain regions 21 and 22. One conventional method includes epitaxially growing silicon carbon (SiC) stressors 23 and 24 in the source and drain regions 21 and 22, therefore tensile stress is applied to a channel region 25 between the source SiC stressor 23 and the drain SiC stressor 24. Improvement in performance of the NMOS device is more difficult to achieve due to challenging process integration when using silicon carbon (SiC) and the improvement is limited due to the fact that the source SiC stressor 23 and the drain SiC stressor 24 are away from the inversion layer directly under gate dielectric 16; therefore the use of an embedded stressor near the inversion layer within NMOS devices would be more desirable to gain performance improvement.

SUMMARY

In one embodiment, a semiconductor structure includes a semiconductor substrate; a gate stack on the semiconductor substrate; a plurality of spacers disposed on laterally opposing sides of the gate stack; source and drain regions proximate to the spacers, and a channel region subjacent to the gate stack and disposed between the source and drain regions; and a stressor subjacent to the channel region, and embedded within the semiconductor substrate, the embedded stressor being formed of a triangular-shape.

According to another embodiment, a semiconductor structure includes a semiconductor substrate; and a metal oxide semiconductor (MOS) device including a gate stack on the semiconductor substrate, a plurality of spacers disposed on laterally opposing sides of the gate stack, source and drain regions proximate to the spacers, and a channel region subjacent to the gate stack and disposed between the source and drain regions, and a stressor subjacent to the channel region, and embedded within the semiconductor substrate, the embedded stressor being formed of a triangular-shape.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

The present invention provides an embedded triangular-shaped stressor within a semiconductor substrate which is used to enhance channel mobility within NMOS devices of a semiconductor structure.

Figure 1:
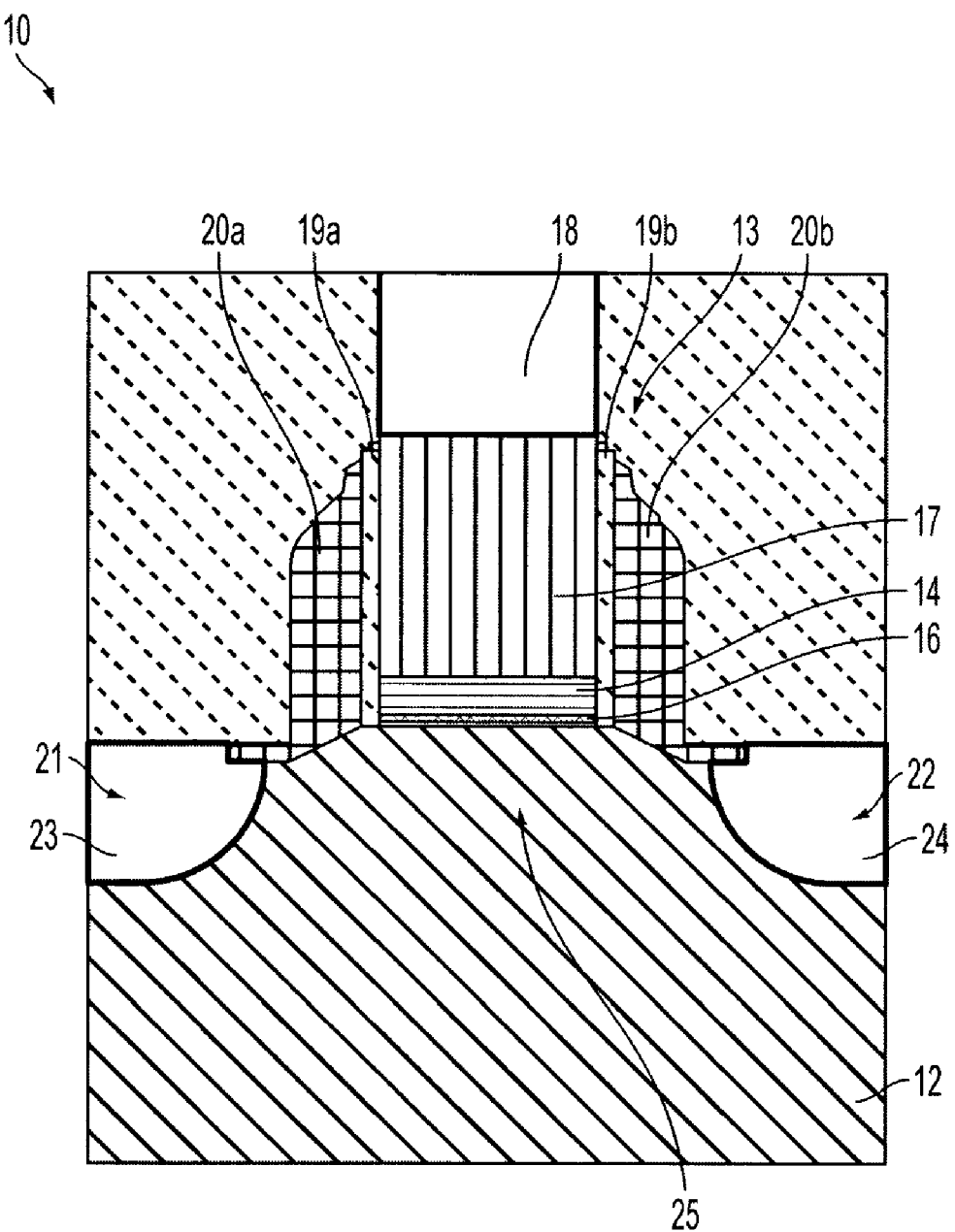
FIG. 1 is a diagram illustrating a conventional NMOS device having source and drain silicon carbon (SiC) stressors.
Figure 2A:
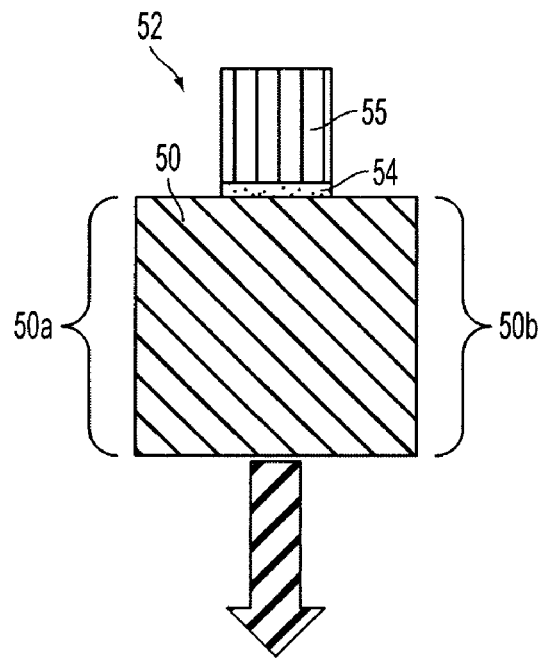
FIG. 2A through 2C are diagrams illustrating fabrication operations for forming an embedded stressor that can be implemented within embodiments of the present invention.

A fabrication method of an embedded stressor within a semiconductor structure will now be described with reference FIGS. 2A through 2C. FIG. 2A is a diagram illustrating an initial fabrication operation of the embedded stressor according to an embodiment of the present invention. As shown in FIG. 2A, a substrate 50 of stressor material is provided. The substrate 50 includes sidewall portions 50a and 50b. According to an embodiment of the present invention, the stressor material is silicon germanium (SiGe). According to one embodiment of the present invention, the Ge concentration in the SiGe may be about 25%. However, the stressor material may vary as necessary. For example, the stressor material may be SiGe or SiGeC.

A dummy gate stack 52 is formed over the substrate 50. The dummy gate stack 52 may include an insulating layer 54 formed of silicon oxynitride (SiON), for example, and a gate electrode 55. The dummy gate stack 52 is used to first form an embedded stressor (as depicted in FIG. 2B) and is then replaced by a functional gate stack during a replacement gate process after the subsequent processing operations have been completed.

Figure 2B:
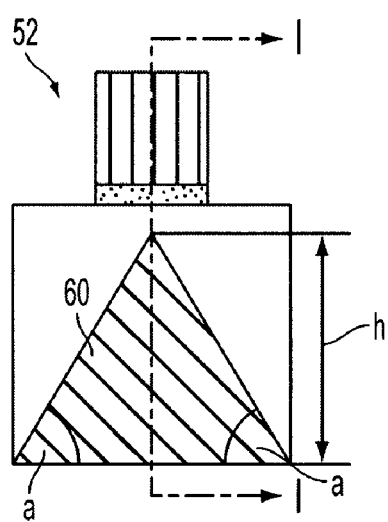
Figure 4:
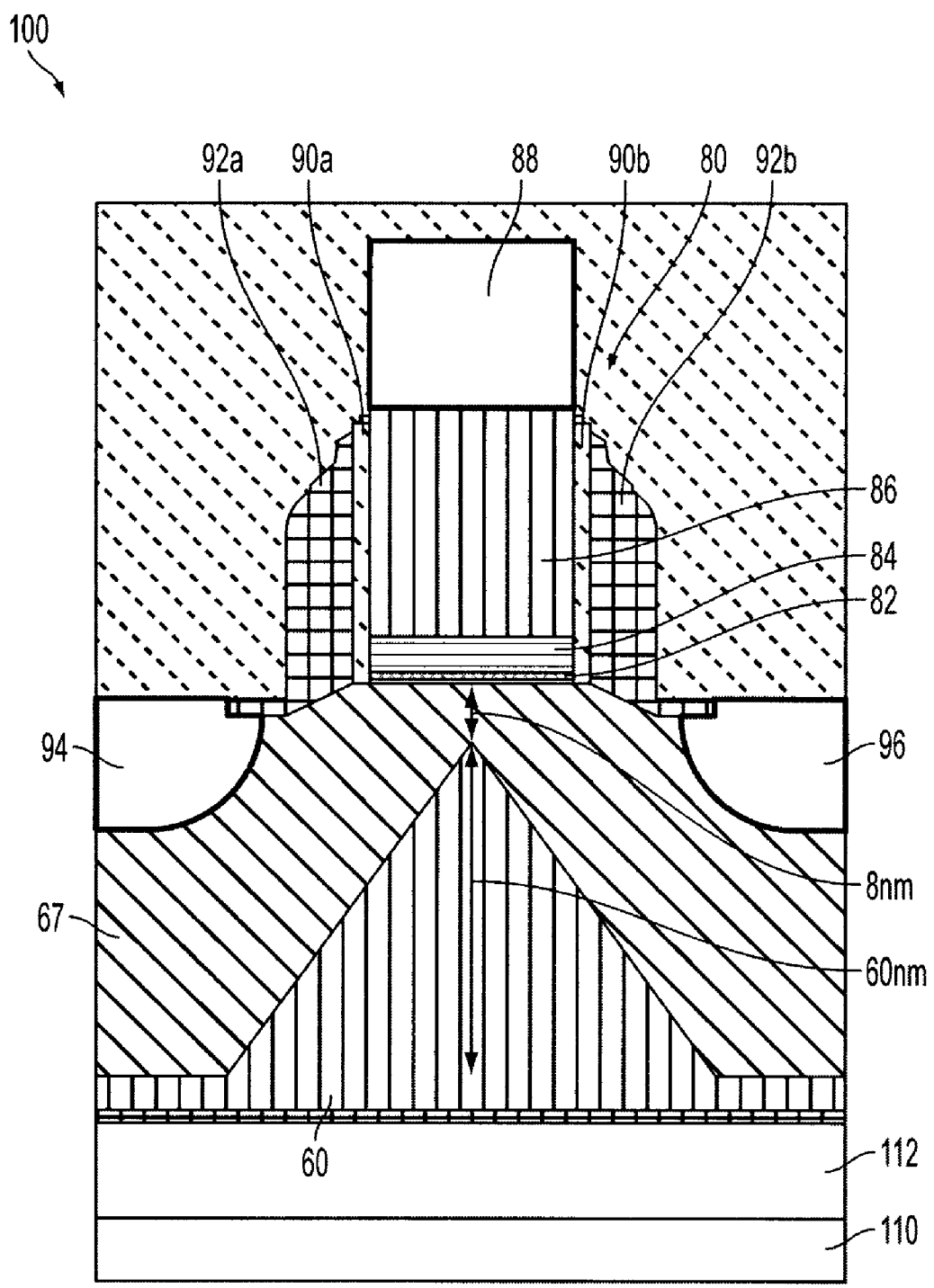
FIG. 4 is a diagram illustrating a semiconductor structure having an embedded stressor that can be implemented within embodiments of the present invention.

FIG. 2B is a diagram illustrating an etching operation of the stressor material that can be implemented within embodiments of the present invention. As shown in FIG. 2B, according to one embodiment, the sidewall portions 50a and 50b of the substrate 50 subjacent to the dummy gate stack 52 are anistropically etched to form an embedded stressor 60. Any conventional etching process may be performed. According to an embodiment of the present invention, anistropically etching of the sidewall portions 52a and 52b forms a triangular-shaped embedded stressor 60. The anistropic etching process is carried out using the dummy gate stack 52 as a mask to pattern the substrate 50. According to one embodiment of the present invention, the anisotropic etching of the substrate 50 is carried out by using one or more dry-etching processes, such as reactive ion etching (RIE). The dry etching is directional and therefore etches the stressor material in approximately equal rates along each sidewall portion 50a and 50b. The pyramidal shape is formed by wet etching which preferentially etches <111> crystallographic plane relative to the <100> plane. The stressor 60 contains SiGe, and therefore, tensile stress is created in the channel region (as depicted in FIG. 4). Therefore, the semiconductor structure is suitable for forming an n-channel in an NMOS device and enhances electron mobility.

After etching, the embedded stressor 60 includes angled sidewall portions 62a and 62b each formed of a predetermined fixed angle a. According to an embodiment of the present invention, the predetermined fixed angle a ranges from approximately 50 degrees to approximately 57 degrees. Further, a top portion 62c of the embedded stressor is a predetermined distance from a gate stack of the MOS device (as depicted in FIG. 4). The predetermined distance ranges from about 5 nanometers (nm) to about 20 nanometers (nm). According to one embodiment of the present invention, the predetermined distance is about 8 nanometers (nm). Further, according to an embodiment of the present invention, the embedded stressor 60 may be formed of a height h ranging from about 60 nanometers (nm) to about 100 nanometers (nm).

Figure 2C:
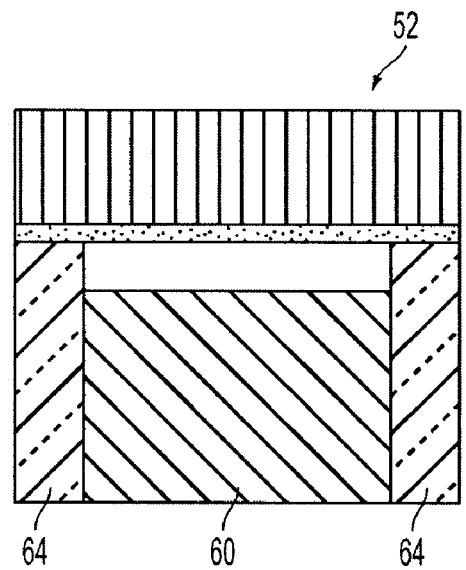

FIG. 2C is a diagram illustrating a cross-sectional view taken along I-I of FIG. 2B. As shown in FIG. 2C, according to an embodiment of the present invention, at least one shallow trench isolation (STI) region 64 adjoins the embedded stressor 60.

Figure 3A:
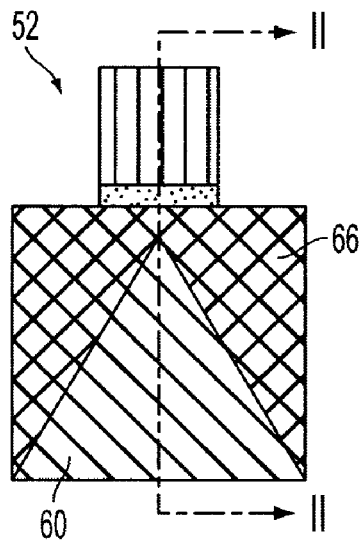
FIGS. 3A through 3C are diagrams illustrating fabrication operations for forming a semiconductor layer over the embedded stressor shown in FIGS. 2B and 2C that can be implemented within embodiments of the present invention.
Figure 3B:
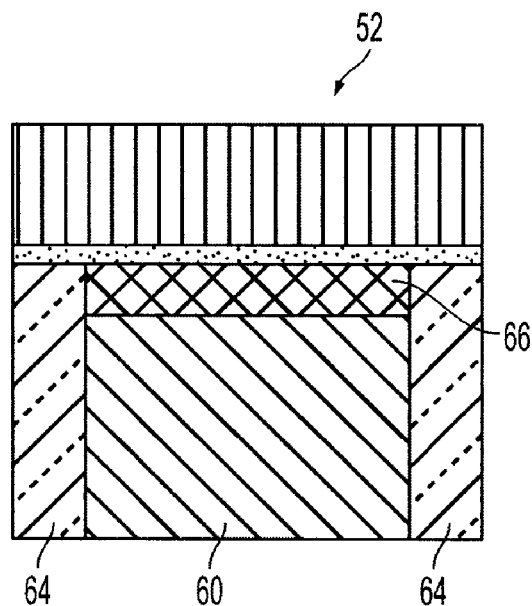
Figure 3C:
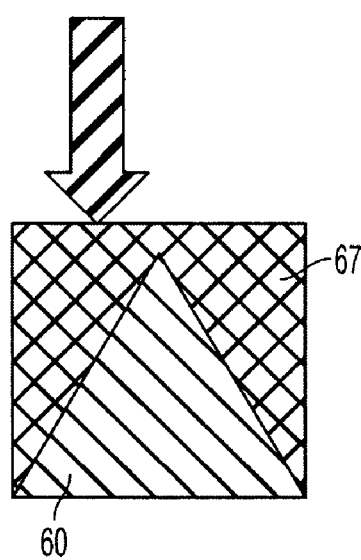

After forming the embedded stressor 60, additional fabrication processes are performed as shown in FIGS. 3A through 3C discussed below.

FIG. 3A is a diagram illustrating a deposition operation of a semiconductor layer that can be implemented within embodiments of the present invention. FIG. 3B is a cross-section view taken along II-II of FIG. 3A. As shown in FIGS. 3A and 3B, a conductive material 66 is epitaxially grown on the angled sidewall portions 62a and 62b and the top portion 62c of the embedded stressor 60. Alternatively, the conductive material 66 may be deposited via other conventional deposition techniques. According to one embodiment of the present invention, the conductive material 66 is formed of silicon (Si). However, the present invention is not limited to silicon (Si) and may vary as necessary. Alternatively, the conductive material 66 may be semiconductor material with smaller lattice size than that of the embedded stressor 60. For example, it may be SiGe with lower Ge concentration.

FIG. 3C is a diagram illustrating a planarizing operation of the conductive material that can be implemented within embodiments of the present invention. As shown in FIG. 3C, after deposition of the conductive material 66, the dummy gate stack 52 is removed. Further, the conductive material 66 is planarized by a planarization technique such as chemical mechanical polishing (CMP) however other conventional planarization techniques may be performed. Therefore, a semiconductor layer 67 formed of conductive material 66 overlies the embedded stressor 60. Additional CMOS processing operations, such as source/drain extension implantation, source/drain implantation, can be further carried out to form a complete semiconductor device (as depicted in FIG. 4), which contains a channel region with the desired stress.

FIG. 4 is a diagram illustrating a semiconductor structure including an embedded stressor that can be implemented within embodiments of the present invention. As shown in FIG. 4, a semiconductor structure 100 is provided. The semiconductor structure 100 includes a gate stack 80 including a gate dielectric 82 and a gate electrode 84 formed over the gate dielectric 82. A polysilicon layer 86 is formed over the gate electrode 84 and a silicide layer 88 is formed over the polysilicon layer 86. Spacers 90a and 90b are formed along sidewalls of the gate electrode 84 to protect the gate electrode 84. The spacers 90a and 90b may be formed of silicon oxide or silicon nitride, for example. Further, spacers 92a and 92b are provided to be electrically conductive. As shown in FIG. 4, the spacers 90a, 90b, 92a and 92b are formed on laterally opposite sides of the gate electrode 84. Using the spacers 92a and 92b and the silicide layer 88 as a mask, recesses are formed by implant to create source and drain regions 94 and 96 in the semiconductor layer 67. The implant may be a conventional source/drain extension implant using arsenic for N channel transistor. The semiconductor structure 100, further includes the embedded stressor 60 formed over a semiconductor substrate 110 that provides physical support for the semiconductor structure 100 and an insulating layer 112. The semiconductor substrate 110, the insulating layer 112 and the semiconductor layer 67 together may formed a semiconductor-on-insulator (SOI) substrate. A bulk substrate may be used instead.

The gate dielectric 82 may be formed of commonly used dielectric materials such as oxides, nitrides, oxynitrides, oxycarbides, carbonitrides, combinations thereof, and multi-layers thereof. The gate electrode 84 may be formed of commonly used conductive materials, such as doped polysilicon, metals, metal silicides, metal nitrides, and the like. According to another embodiment of the present invention, the gate dielectric 82 may be a high-k dielectric formed by depositing high-k material and etching the material to form the high-k dielectric. Further, the gate electrode 84 may be a metal gate electrode.

Figure 5A:
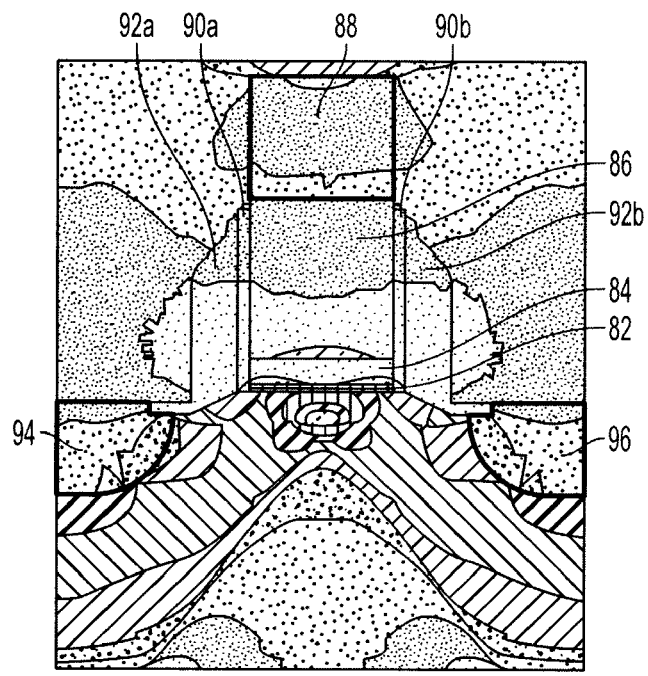
FIGS. 5A through 5F are graphs illustrating stress effect of the embedded stressor shown in FIG. 4 that can be implemented within embodiments of the present invention compared to that of the conventional art.
Figure 5B:
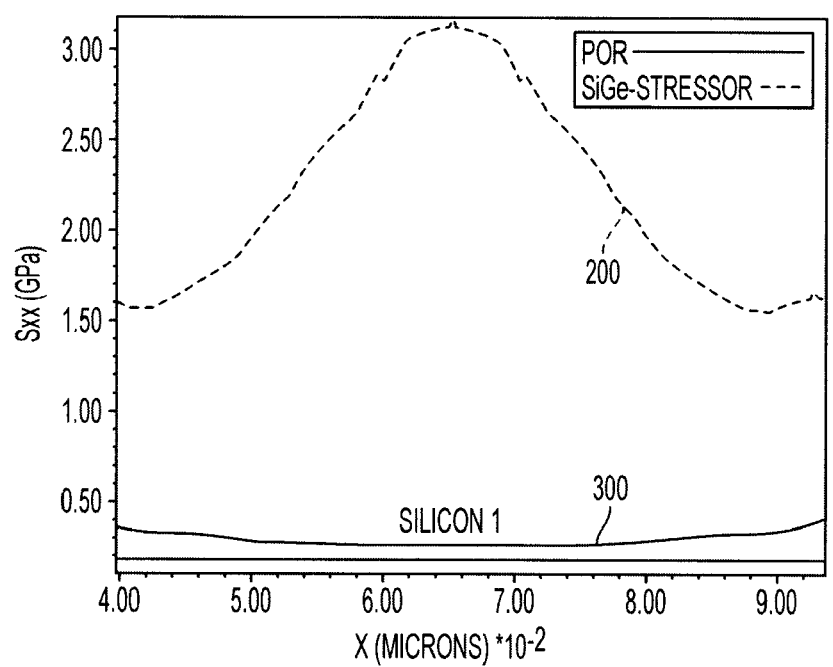
Figure 5C:
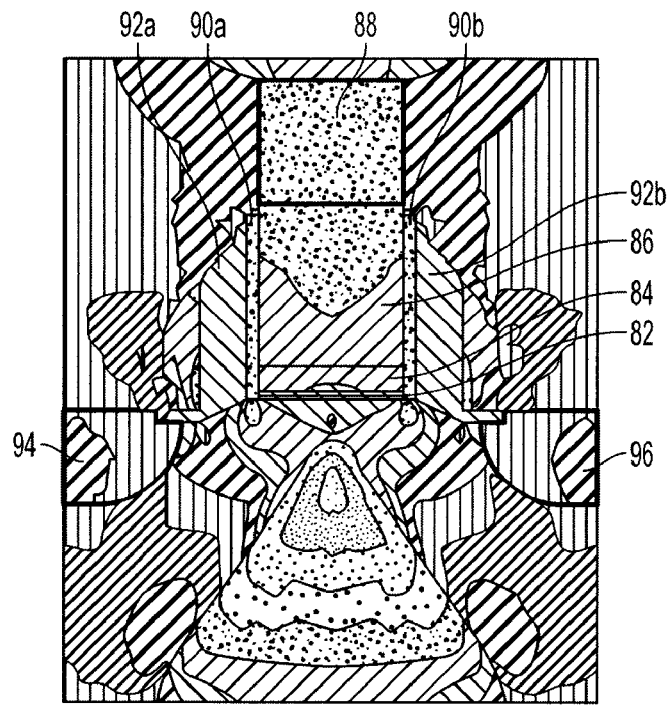
Figure 5D:
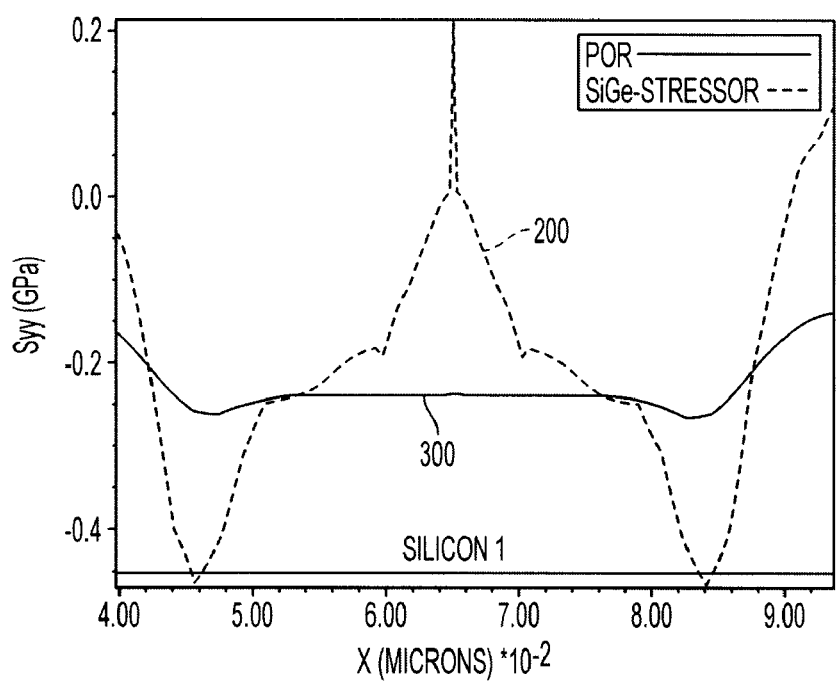
Figure 5E:
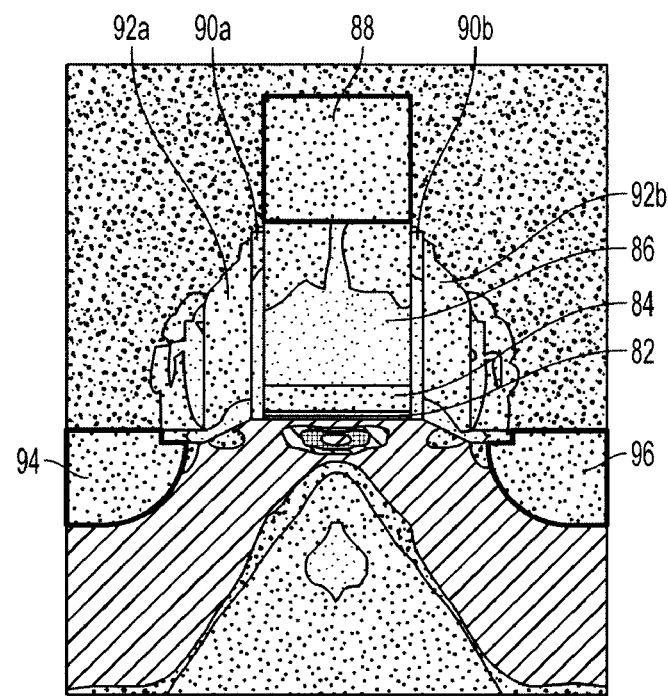
Figure 5F:
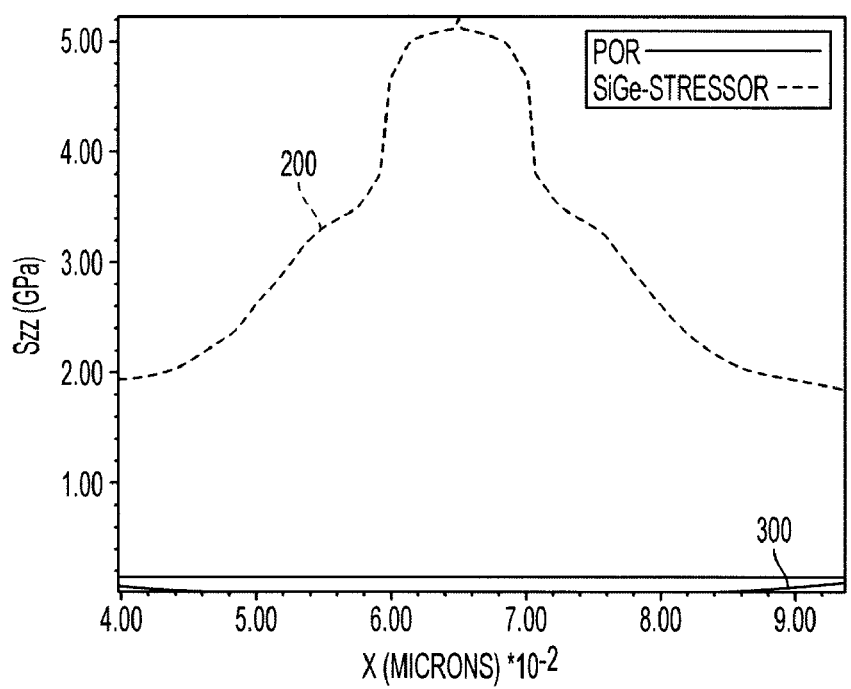

FIGS. 5A through 5F are graphs illustrating stress effect of the embedded stressor shown in FIG. 4 that can be implemented within embodiments of the present invention compared to that of the conventional art. According to one embodiment of the present invention, the effective stress may be calculated by using equation (1):

$$S\textit{eff} = Sxx - 1.6*Syy + 0.7*Szz$$

Wherein Sxx represents stress level in the x-direction (i.e., source-to-drain direction; Syy represents stress level in the y-direction (i.e., a direction vertical to the surface of the semiconductor layer 67); and Szz represents stress level in the z-direction (i.e., a width direction). FIGS. 5A, 5C and 5E are 2-D stress profiles for each stress component. FIG. 5A is for stress in the Sxx orientation, FIG. 5C is for stress in the Syy orientation, and FIG. 5E is for stress in the Szz orientation. While FIGS. 5B, 5D, and 5F are taken at 2n m below surface to get a numeric idea. Further shown in the graphs of FIGS. 5B, 5D and 5F, the line indicated by reference numeral 200 represents the stress level of the present invention and the line indicated by reference numeral 300 represents the stress level of the conventional art.

FIGS. 5A and 5B are a diagram and graph respectively illustrating the stress level in the x-direction (Sxx). As shown in FIG. 5B, the line 200 shows a significant increase in the stress level at approximately 2 nanometers (nm) below a surface of the semiconductor layer 67 in the present invention compared to that of the conventional art. For example, as shown, the stress level in the center of the channel region is approximately 3.1 GPa for the present invention compared to approximately 0.28 GPa for the conventional art.

FIGS. 5C and 5D are a diagram and graph respectively illustrating the stress level in the y-direction (Syy) at approximately 2 nanometers (nm) below a surface of the semiconductor layer 67. As shown in FIG. 5D, the stress level at 0.065 micros is approximately −200 MPa for the present invention compared to approximately −250 MPa for the conventional art.

FIGS. 5E and 5F are a diagram and graph respectively illustrating the stress level in the z-direction (Szz) level at approximately 2 nanometers (nm) below a surface of the semiconductor layer 67. As shown in FIG. 5F, the stress level in the center channel region at 0.065 microns is 5 GPa for the present invention compared to 0 GPa for the conventional art.

According to the current embodiment of the present invention, FIGS. 5A through 5F are the stress level from TCAD simulation to illustrate the present invention. These simulations are generated based on embedded SiGe with 25% Ge.

Embodiments of the present invention include an embedded SiGe stressor which provides higher drive currents over the current HKMG technology and enhances electron mobility.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one ore more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A semiconductor structure comprising:
   a semiconductor substrate;
   a gate stack on the semiconductor substrate;
   a plurality of spacers disposed on laterally opposing sides of the gate stack;
   source and drain regions proximate to the spacers, and a channel region subjacent to the gate stack and disposed between the source and drain regions; and
   a stressor subjacent to the channel region, and embedded within the semiconductor substrate, the stressor being formed of a triangular-shape, having angled sidewall portions; and a conductive material formed on and in direct contact with the angled sidewall portions of said stressor.

2. The semiconductor structure of claim 1, wherein the gate stack comprises a high-k dielectric and a metal gate electrode.

3. The semiconductor structure of claim 1, wherein the stressor comprises silicon germanium (SiGe) and the semiconductor substrate comprises silicon.

4. The semiconductor structure of claim 3, wherein the semiconductor structure is an n-type metal oxide semiconductor (NMOS) device.

5. The semiconductor structure of claim 3, wherein the stressor comprises angled sidewall formed of a predetermined angle ranging from approximately 50 to 57 degrees.

6. The semiconductor structure of claim 5, wherein the stressor is of a height ranging from approximately 60 nanometers (nm) to 100 nanometers (nm).

7. The semiconductor structure of claim 5, wherein the stressor is a predetermined distance from a bottom surface of the gate stack, the predetermined distance ranging from approximately 5 nanometers (nm) to approximately 20 nanometers (nm).

8. The semiconductor structure of claim 1, further comprising:
   at least one shallow trench isolation (STI) region adjoining the stressor.

9. A semiconductor structure comprising:
   a semiconductor substrate; and
   a metal oxide semiconductor (MOS) device comprising:
      a gate stack on the semiconductor substrate,
      a plurality of spacers disposed on laterally opposing sides of the gate stack,
      source and drain regions proximate to the spacers, and a channel region subjacent to the gate stack and disposed between the source and drain regions, and
      a stressor subjacent to the channel region, and embedded within the semiconductor substrate, the stressor being formed of a triangular-shape having angled sidewall portions; and a conductive material formed on and in direct contact with the angled sidewall portions of said stressor.

10. The semiconductor structure of claim 9, wherein the MOS device is an n-type metal oxide semiconductor (NMOS) device and the stressor is formed of silicon germanium (SiGe).

* * * * *